United States Patent
Wu et al.

(10) Patent No.: US 12,267,986 B2
(45) Date of Patent: Apr. 1, 2025

(54) COOLING DEVICE

(71) Applicants: INVENTEC (PUDONG) TECHNOLOGY CORPORATION, Shanghai (CN); INVENTEC CORPORATION, Taipei (TW)

(72) Inventors: Jiang-Jun Wu, Shanghai (CN); Yi-Dong Ji, Shanghai (CN); Cheng Han, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 281 days.

(21) Appl. No.: 18/123,388

(22) Filed: Mar. 20, 2023

(65) Prior Publication Data
US 2024/0074097 A1 Feb. 29, 2024

(30) Foreign Application Priority Data
Aug. 31, 2022 (CN) .......................... 202211058080.7

(51) Int. Cl.
H05K 7/20 (2006.01)
G06F 1/20 (2006.01)
H01L 23/473 (2006.01)

(52) U.S. Cl.
CPC .......... *H05K 7/20254* (2013.01); *G06F 1/20* (2013.01); *H01L 23/473* (2013.01)

(58) Field of Classification Search
CPC ........... H05K 7/20254; H05K 7/20309; H05K 7/20772; H01L 23/473
See application file for complete search history.

(56) References Cited

U.S. PATENT DOCUMENTS

| 10,548,240 | B1 * | 1/2020 | Iyengar | H05K 7/20509 |
| 11,355,418 | B2 * | 6/2022 | Yu | H01L 23/3677 |
| 11,876,036 | B2 * | 1/2024 | Choobineh | H05K 7/20254 |
| 11,889,613 | B1 * | 1/2024 | Castillo Orozco | G06F 1/20 |

* cited by examiner

*Primary Examiner* — Robert J Hoffberg

(57) ABSTRACT

The present disclosure provides a cooling device, including a cooling plate and a mounting cover. A lower flow channel is provided in the cooling plate, a top of the cooling plate is provided with a water outlet and two openings. The water outlet is located between the two openings. The mounting cover is sealed on the top of the cooling plate. The mounting cover comprises a first mounting cover and a second mounting cover. The first mounting cover and the cooling plate form an intermediate flow channel, the second mounting cover and the cooling plate form a branch flow channel. The intermediate flow channel is in communication with the two branch flow channels, The first mounting cover is provided with a water inlet, and the two branch flow channels are in communication with the lower flow channel through the two openings.

15 Claims, 6 Drawing Sheets

COOLING DEVICE

CROSS-REFERENCE TO RELATED APPLICATIONS

This application claims priority of Chinese Patent Application No. 202211058080.7, filed on Aug. 31, 2022, the content of which is hereby incorporated by reference in its entirety.

TECHNICAL FIELD

The present disclosure relates to technical field of CPU cooling, in particular to a cooling device.

BACKGROUND

In the prior art, CPU is cooled in the following two ways. One is to use air cooling to dissipate heat, which uses low-temperature air to contact heat-generating components to exchange heat. Due to a lower specific heat of air, the heat dissipation limit is in a range of 350 W to 400 W, which has problems such as relatively low heat dissipation efficiency and poor heat dissipation capacity of local hot spots. In addition, a full speed vibration of a fan affects the reliability of components, which causes components with different resonance frequencies to resonate at the same time, thus increasing the probability of damage to improperly installed components due to twisting, collision, etc. and high noise levels. The other one is to use liquid cooling to dissipate heat, which has the advantages of efficient cooling effect and low noise, including indirect liquid cooling (plate-type liquid cooling) and direct contact liquid cooling. Currently, the direct contact liquid cooling still has problems such as high technical difficulty, low maturity, and large obstacles to mass production applications, such as the airtight design of containers, strict requirements for liquid coolants, and whether a direct contact of the coolant with the heating element affects its stability, which also needs to be studied. The plate-type liquid cooling is widely used in the industry due to its excellent heat dissipation performance, relatively mature technology, and easy mass production. The common plate-type liquid cooling has a long flow channel, a large internal resistance, and a large pressure difference between an inlet and an outlet of the flow channel, which needs to increase a power of a pump and increases the cost.

SUMMARY

According to some exemplary embodiments of the present disclosure, a cooling device is provided.

A cooling device includes a cooling plate and a mounting cover. A lower flow channel is provided in the cooling plate, a top of the cooling plate is provided with a water outlet and two openings in communication with the lower flow channel. The water outlet is located between the two openings, the water outlet is configured to be connected to a water outlet nozzle. A bottom of the cooling plate is configured to be in contact with a heat source. The mounting cover is sealed on the top of the cooling plate. The mounting cover has a C-shaped cross section. The mounting cover includes a first mounting cover and two second mounting covers provided at both ends of the first mounting cover along a first direction. The first mounting cover and the cooling plate form an intermediate flow channel, each second mounting cover and the cooling plate form a branch flow channel. The intermediate flow channel is in communication with the two branch flow channels. The first mounting cover is provided with a water inlet, the water inlet is configured to be connected to a water inlet nozzle. The two branch flow channels are in communication with the lower flow channel through the two openings, respectively.

These and other objects, advantages, purposes and features will become apparent upon review of the following specification in conjunction with the drawings.

DETAILED DESCRIPTION OF THE EMBODIMENTS

Figure 1:
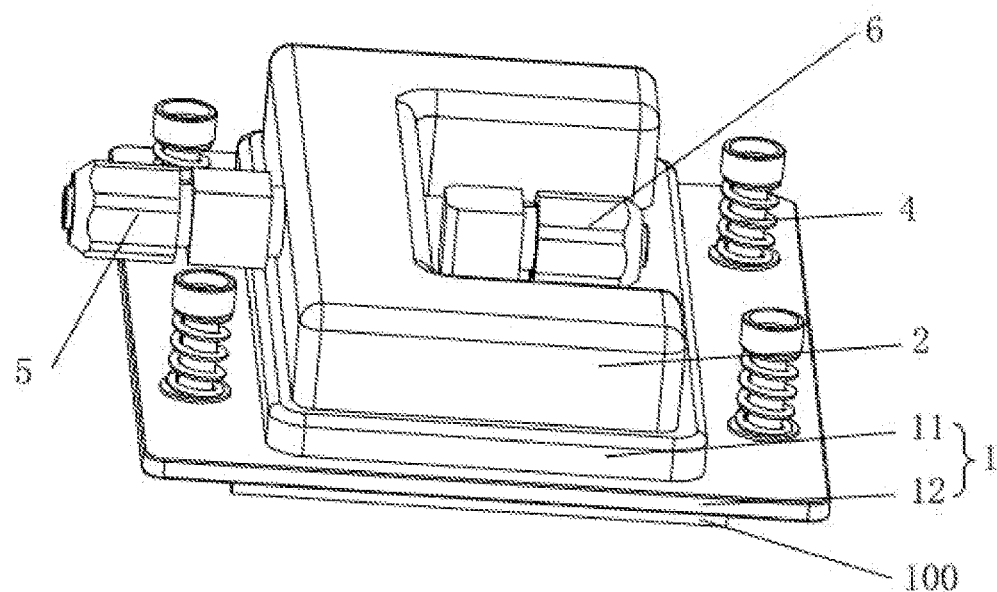
FIG. 1 is a perspective view of a cooling device according to an embodiment of the present disclosure.
Figure 2:
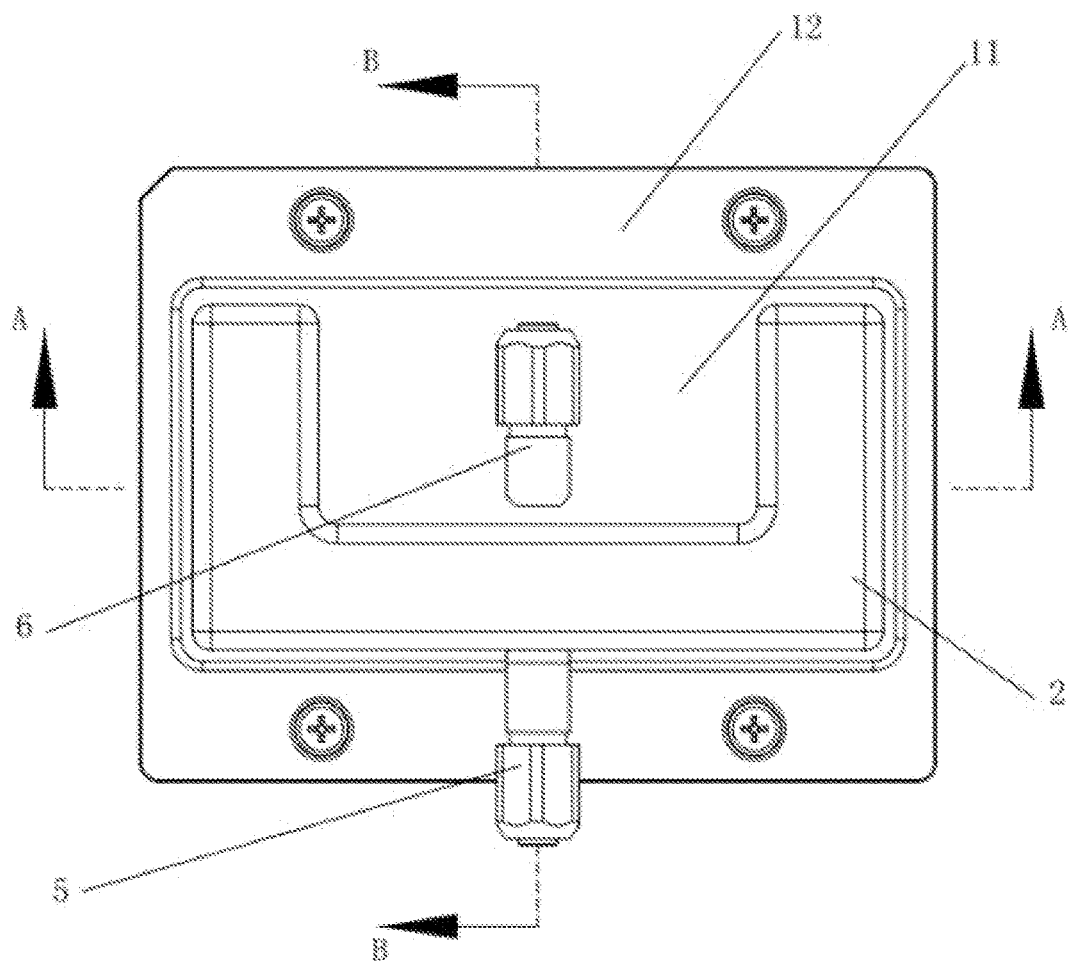
FIG. 2 is a front view of the cooling device of FIG. 1.
Figure 3:
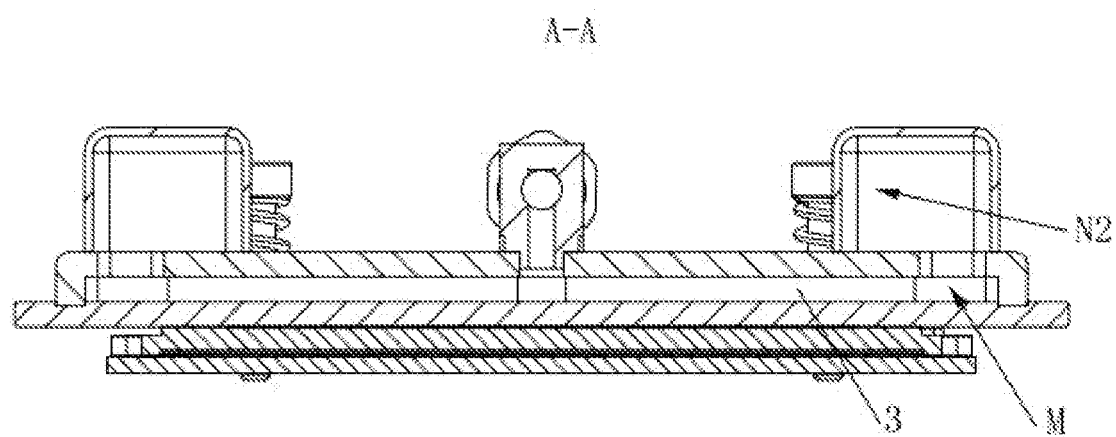
FIG. 3 is a cross-sectional view taken along A-A in FIG. 2.
Figure 4:
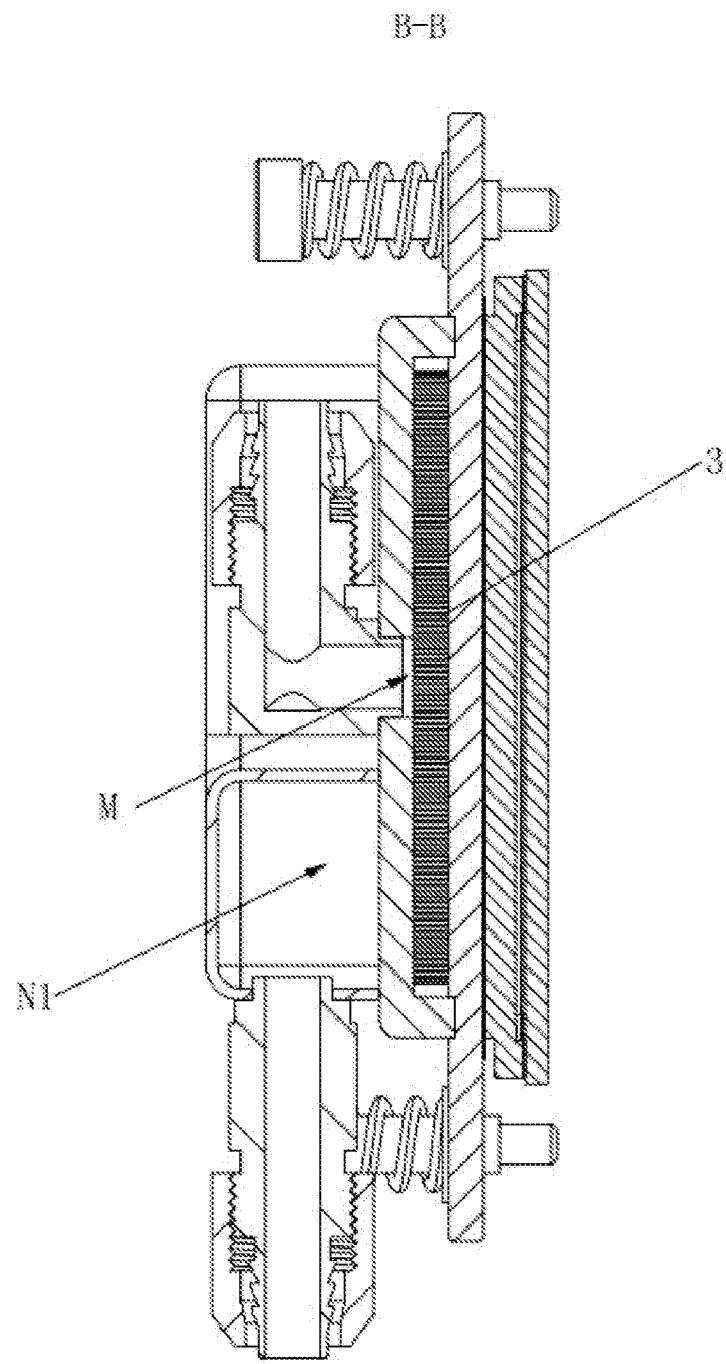
FIG. 4 is a cross-sectional view taken along B-B in FIG. 2.

In order to make the purposes, technical solutions and advantages of the embodiments of the present disclosure clearer, the technical solutions in the embodiments of the present disclosure will be clearly and completely described below in conjunction with the drawings in the embodiments of the present disclosure. Apparently, the described embodiments are some of the embodiments of the present disclosure, but not all of them. Based on the embodiments of the present disclosure, all other embodiments obtained by those skilled in the art without creative efforts fall within the protection scope of this present disclosure.

In the present invention, unless otherwise expressly specified and limited, the terms "mount", "connect", "contact", "fix" and other terms should be understood in a broad sense, for example, they can be fixed connections, removable connections, or integrated. It can be mechanical connection or electrical connection. It can be directly connected or indirectly connected through an intermediate medium. It can be the connection within two elements or the interaction relationship between two elements, unless otherwise expressly limited. For those skilled in the art, the specific meaning of the above terms in the present application can be understood according to the specific situation.

In the present invention, unless otherwise expressly specified and limited, the first feature "above" or "below" the second feature may be in direct contact with the first and second features, or the first and second features may be in indirect contact through an intermediate medium. Moreover, the first feature is "above" the second feature, but the first feature is directly above or diagonally above the second feature, or it only means that the horizontal height of the first feature is higher than the second feature. The first feature is "below" of the second feature, which can mean that the first feature is directly below or obliquely below the second feature, or simply that the horizontal height of the first feature is less than that of the second feature.

As shown in FIGS. 1 to 5, according to an embodiment, a cooling device is provided, which includes a cooling plate 1 and a mounting cover 2. A lower flow channel M is provided in the cooling plate 1, and a top of the cooling plate 1 is provided with a water outlet 111 and two openings 112 in communication with the lower flow channel M. The water outlet 111 is located between the two openings 112, and the water outlet 111 is configured to connect a water outlet nozzle 6. A bottom of the cooling plate 1 is configured to be in contact with a heat source 100, such as a CPU (central processing unit). The mounting cover 2 is sealed on the top of the cooling plate 1, and the mounting cover 2 has a C-shaped cross section. The mounting cover 2 includes a first mounting cover 21 and a second mounting cover 22 provided at both ends of the first mounting cover 21 along a first direction. The first mounting cover 21 and the cooling plate 1 form an intermediate flow channel N1, the second mounting cover 22 and the cooling plate 1 form a branch flow channel N2, and the intermediate flow channel N1 is in communication with the two branch flow channels N2. The first mounting cover 21 is provided with a water inlet 211, the water inlet 211 is configured to be connected to a water inlet nozzle 5. The two branch flow channels N2 are in communication with the lower flow channel M through the two openings 112, respectively. Specifically, the water inlet 211 and the water outlet 111 are mounted with the water inlet nozzle 5 and the water outlet nozzle 6, respectively, so as to connect other devices.

The mounting cover 2 and the top of the cooling plate 1 form an upper flow channel, and the upper flow channel includes the intermediate flow channel N1 and two division channels N2 in communication with the intermediate flow channel N1. Since the mounting cover 2 is arranged in a C shape, fluid in the intermediate flow channel N1 can flow evenly into the two branch flow channels N2. The lower flow channel M has the two openings 112 and the water outlet 111 located between the two openings 112, and the two branch flow channels N2 are in communication with the lower flow channel M through the two openings 112. Since the mounting cover 2 is C-shaped, the two branch flow channels N2 correspond to the two openings 112, respectively, the two openings 112 are located at both ends of the cooling plate 1 along the first direction. During cooling, the heat source 100 mounted on the bottom of the cooling plate 1 is in contact with the bottom of the cooling plate 1 for heat exchange. Coolant enters the intermediate flow channel N1 from the water inlet 211, and then enters the two branch flow channels N2. Under the action of pressure and gravity, the coolant enters from both sides of the lower flow channel M through two openings 112, and flows out through the water outlet 111. The lower flow channel M between the two openings 112 and the water outlet 111 forms two parallel cooling flow channels, which shortens a length of the flow channel.

During a flow channel design, the pressure loss of the cooling plate 1 is represented by a damage amount of the velocity head of the water outlet 111, and the Hagen-Poiseuille velocity head loss may be calculated by the formula, $H_{out}=f(l_\Sigma, V, D_m)$, where $l_\Sigma$ is a total path of the flow channel, V is a velocity of fluid at an inlet of the flow channel, and $D_m$ is an equivalent diameter of the flow channel. The pressure loss between the opening 112 and the water outlet 111 may measure a power of a pump. Hagen-Poiseuille velocity head loss may be calculated by the formula, $H_{out}=k_f \cdot l_\Sigma \cdot V^2/(2 \cdot D_m \cdot g)$. In this embodiment, the mounting cover 2 is arranged above the cooling plate 1 to form a two-dimensional flow channel of the upper flow channel and the lower flow channel M. The water separation design of the two openings 112 shortens a total length of the upper flow channel and the lower flow channel M, and increases the equivalent diameter of the flow channel, thus reducing Hagen-Poiseuille velocity head loss, effectively reducing total pressure loss of liquid between the inlet and an outlet, reducing the power requirement of the pump, and thus reducing the cost. A three-dimensional double-layer flow channel design is adopted, and a liquid flow heat transfer efficiency is proportional to a heat transfer area. Conventional flow channels are plane flow channels, in order to increase a flow contact area, the plane flow channel needs to be bent multiple times, which greatly increases a flow resistance. However, the double-layer flow channel design in this solution adds an additional one-dimensional heat transfer area.

The fluid is liquid, and the liquid flow heat exchange efficiency is much higher than air heat exchange efficiency, which reduces a dependence of heat dissipation on high-noise equipment such as fans, and the overall system noise is low. Furthermore, using water as the liquid medium has the advantages of low cost, easy to access, no pollution, and no secondary by-products. Water has a large specific heat capacity, good thermal shock resistance, low flow viscosity, low fluid flow resistance, simple requirements for external flow driving force, and high heat exchange efficiency through liquid forced convection heat exchange technology.

In an embodiment, both the cooling plate 1 and the mounting cover 2 are copper plates, which have excellent thermal conductivity. Further, the mounting cover 2 is welded to the cooling plate 1 to improve the overall structural strength and sealing performance, which can be applied to harsh environments, thereby improving the stability and reliability of the product and prolong the service life.

Figure 5:
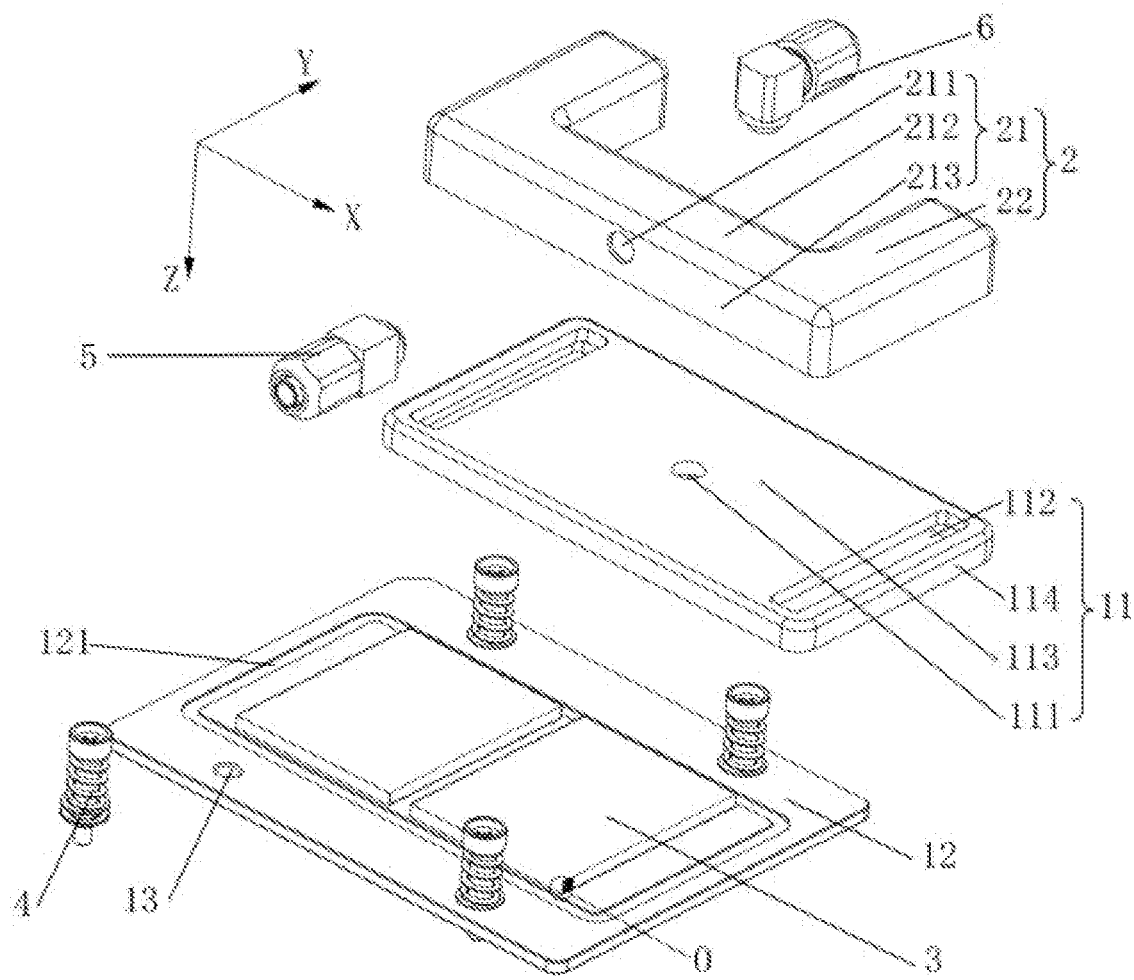
FIG. 5 is an exploded view of the cooling device of FIG. 1.

In an embodiment, as shown in FIG. 5, the opening 112 is a rectangular strip opening, which increases an area of the opening 112. Under the condition of the same flow rate, the flow velocity of the lower flow channel M at the opening 112 is reduced, and a pressure difference between the opening 112 and the outlet 111 is reduced. Further, the area of the opening 112 of the rectangular strip opening is about 53 mm×7 mm.

In an embodiment, the branch flow channel N2 is provided along a second direction, and the first direction is perpendicular to the second direction. The area of the opening 112 is increased as much as possible, and further, the length of the branch flow channel N2 in the second direction is greater than that of the opening 112 in the second direction, so as to ensure the flow rate entering the lower flow channel M through the opening 112. In an embodiment, the lengths of the branch flow channel N2 and the opening 112 in the second direction may be approximately the same, which increases the flow rate of the fluid in the branch flow channel N2 through the opening 112, so that the fluid in the branch flow channel N2 enters the lower flow channel M through the opening 112 as much as possible. Further, a length of the lower flow channel M in the second direction is greater than a length of the branch flow channel N2, so as to prevent the branch flow channel N2 from being too long and increasing the overall volume. In an embodiment, the length of the lower flow channel M in the second direction is approximately the same as the length of the branch flow channel N2 in the second direction. Optionally, the length of the lower flow channel M in the second direction is approximately the same as the length of the opening 112 in the second direction, so that the fluid flowing through the opening 112 flows into the lower flow channel M as uniformly as possible. Further, the length of the opening 112 in the second direction is the same as the length of the lower flow channel M in the second direction and the length of the branch flow channel N2 along the second direction.

In an embodiment, as shown in FIG. 5, a periphery of the cooling plate 1 is provided with a plurality of mounting holes 13, and the cooling device further includes a plurality of fasteners 4. The fasteners 4 are configured to extend through mounting holes 13 and be threadedly connected to an external mounting platform of the heat source 100, so that heat source 100 is fixed to and in contact with the cooling plate 1 to achieve uniform heat dissipation using multiple hot spots.

In an embodiment, as shown in FIG. 5, the cooling plate 1 includes a first plate 11 and a second plate 12, and the first plate 11 and the second plate 12 are welded to improve structural strength and reduce the risk of leakage. The lower flow channel M is provided between the first plate 11 and the second plate 12, the mounting cover 2 is connected to the first plate 11, the opening 112 and the water outlet 111 are provided on the first plate 11, and the second plate 12 is configured to be in contact with the heat source 100. Further, both the first plate 11 and the second plate 12 use copper as the processing material, and the second plate 12 made of copper has good temperature uniformity, low thermal resistance, and a small surface temperature difference with the heat source 100, which facilitates further heat being carried away. Specifically, two rectangular strip openings are provided on the first plate 11, the water outlet 111 is a circular hole, which is provided between the two rectangular strip openings.

In an embodiment, as shown in FIG. 5, the first plate 11 includes a top plate 113 and a frame 114 connected to the top plate 113. The top plate 113 is supported on the second plate 12 through the frame 114. The second plate 12 is provided with an annular groove 121. A bottom of the frame 114 is connected in the annular groove 121, which improves assembly accuracy and assembly efficiency. The first plate 11 is a hollow structure, and the second plate 12 is a flat structure, which is convenient for processing. Further, an area of the second plate 12 is greater than that of the top plate 113, and the mounting holes 13 are provided on the second plate 12.

Further, the water outlet 111 is provided on the top plate 113, so that the structure is more compact and the overall volume is reduced. Further, the first mounting cover 21 and the two second mounting covers 22 of the mounting cover 2 surround three sides of the water outlet nozzle 6 to obtain a compact structure.

In an embodiment, the first mounting cover 21 has a top surface 212 and two side surfaces 213 distributed in the second direction. The water inlet 211 is provided on the side surface 213 away from the water outlet 111 in the second direction. The water inlet nozzle 5 is connected to one of the side surfaces 213, and the water outlet nozzle 6 faces the other side surfaces 213 with a certain distance to facilitate the disassembly and assembly of the water outlet nozzle 6. Further, the water outlet nozzle 6 is a bent nozzle, and the water inlet nozzle 5 is a straight nozzle. In other embodiments, the water outlet nozzle 6 and the water inlet nozzle 5 may also be water nozzles of other forms, which are not limited herein.

In an embodiment, as shown in FIG. 5, two fin plates 3 are provided in the lower flow channel M, the two fin plates 3 are spaced apart, and the water outlet 111 is provided between the two fin plates 3. The fluid enters from the two openings 112 and forms two tributaries flowing from two sides of the lower flow channel M to the middle of the lower flow channel M at the same time. In the process of flowing from the opening 112 to the outlet 111, the fluid flows through the fin plate 3 and is fully in contact with the fin plate 3 for heat exchange, so as to take away the heat on the surface of the fin plate 3. The heat exchange efficiency and cooling effect are further improved by providing the fin plate 3. Further, the length of the fin plate 3 in the second direction may be the same as the length of the opening 112.

Figure 6:
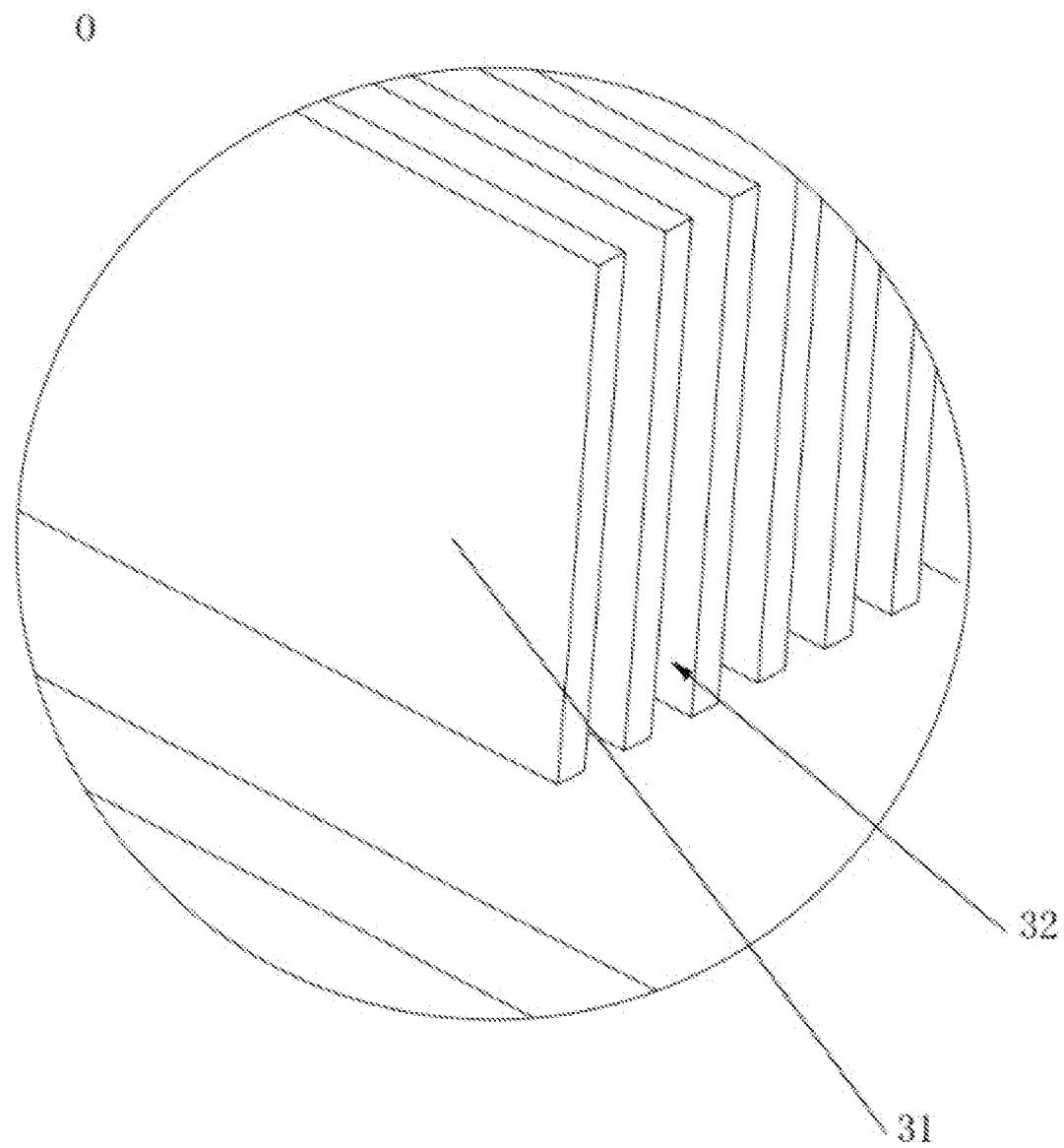
FIG. 6 is an enlarged view of part 0 in FIG. 5.

In an embodiment, as shown in FIG. 6, the fin plate 3 includes a plurality of fins 31 arranged in parallel and spaced apart. A through groove 32 is formed between adjacent two fins 31, and the through groove 32 extends along the first direction. The opening 112 and the water outlet 111 are located at both ends of the through groove 32, respectively. The fluid flows uniformly through each through groove 32, which improves the flow uniformity, and thus improves the cooling uniformity. A spacing between the fins 31 may be small, the fin 31 may be relatively thin, and the fin 31 may be relatively high. In an embodiment, the distance between two adjacent fins 31 is about 0.2 mm to about 0.4 mm. In an embodiment, a spacing between two fin plates 3 is about 5 mm to about 6 mm. Specifically, the spacing between two fins 31 may be 0.3 mm, and the spacing between two fin plates 3 may be 5.8 mm.

Further, the fin plate 3 is a copper plate with a high thermal conductivity. The fin plate 3 may be processed by a tooth cutting method. The copper plate is tooth cut successively in the front and rear directions, and two groups of fins 31 are processed on the copper plate.

Figure 7:
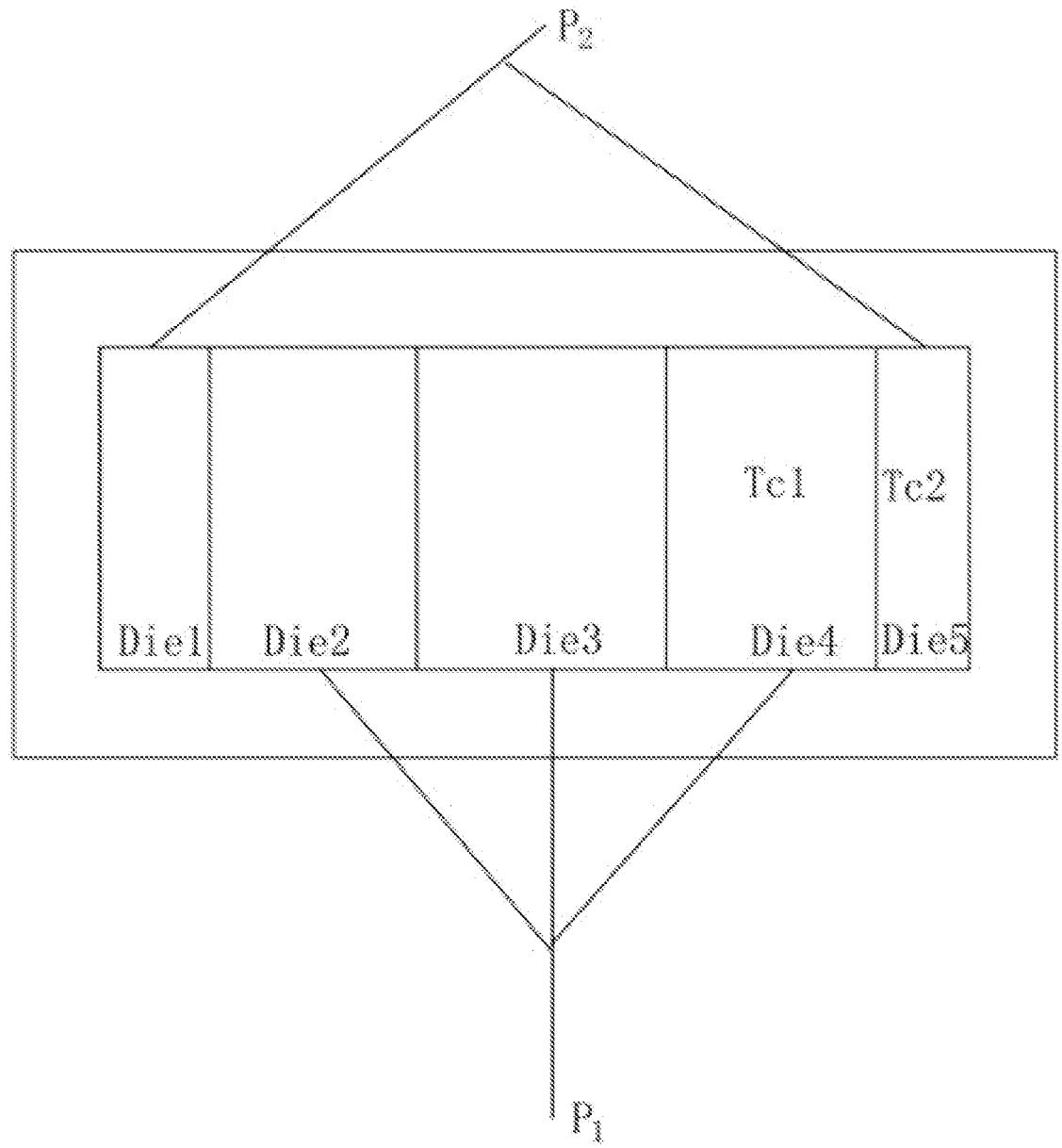
FIG. 7 is a simulation diagram of cooling a heat source using the cooling device according to an embodiment of the present disclosure.

Referring to Table 1 and FIG. 7, according to the package thermal model and test method in the Orffs Corner TTV Package Thermal Model User Guide, the cooling device fixed to a heat source is simulated, so as to test the heat dissipation performance and pressure loss of the cooling device. The simulation data is shown in Table 2 below.

TABLE 1

| Cooling FF/Package TDP | P1 [W] | P2 [W] | Tla/Tfl [° C.] | Tc1_max [° C.] | Tc2_max [° C.] |
|---|---|---|---|---|---|
| Liquid CP/500 W | 430 | 70 | 48 | 65 | 64 |

TABLE 2

| LPM | Die1 Tc | Die2 Tc | Die3 Tc | Die4 Tc | Die5 Tc | Inlet T | Outlet T | Pressure drop (Pa) |
|---|---|---|---|---|---|---|---|---|
| 0.8 | 52.5 | 54.6 | 56.5 | 54.6 | 52.6 | 40 | 48.9 | 1003.3 |
| 1 | 51.1 | 52.8 | 54.6 | 52.8 | 51.2 | 40 | 47.1 | 1473.6 |
| 1.2 | 50.3 | 51.6 | 53.3 | 51.6 | 50.3 | 40 | 46 | 2026 |
| 1.4 | 49.7 | 50.9 | 52.4 | 50.9 | 49.8 | 40 | 45.2 | 2646 |
| 1.6 | 49.3 | 50.3 | 51.8 | 50.3 | 49.4 | 40 | 44.6 | 3356 |
| 1.8 | 49 | 49.9 | 51.2 | 49.9 | 49.1 | 40 | 44.1 | 4153 |
| 2 | 48.8 | 49.5 | 50.7 | 49.5 | 48.6 | 40 | 43.7 | 5014 |
| 3 | 48.1 | 48.4 | 49.4 | 48.4 | 48.2 | 40 | 42.3 | 11027 |
| 4 | 47.8 | 47.9 | 48.8 | 48 | 47.9 | 40 | 41.7 | 18981 |

As the flow rate increases, the temperature at the simulated sensor points Tc1, Tc2 and outlet 111 shows a decreasing trend. In the range of 0.8 L/min to 1.2 L/min, the temperature decreases more sharply. When the flow rate continues to increase, the range of curve change gradually tends to be stable, and the temperature at each point tends to a stable value. According to the maximum temperature in Table 1, the maximum temperature of the simulated sensor points Tc1 and Tc2 meet the design requirements. Meanwhile, the pressure loss of the water inlet 211 and the water outlet 111 gradually increases, and the demand for pump work also becomes higher. The variation range of the pressure drop curve increases gradually with the increase of the flow rate. Considering the balance of pressure loss and temperature, when the flow rate is 1.2 L/min to 1.4 L/min, the cost performance is good.

The Tout temperature is calculated by the following empirical formula, Tout=0.86*P/LPM/60+Tin. The theoretical calculation results are shown in Table 3.

TABLE 3

| LPM | Outlet T (Theoretical calculation value) | Outlet T (Simulation calculation value) | Deviation (%) |
|---|---|---|---|
| 0.8 | 49.0 | 48.9 | −0.2 |
| 1 | 47.2 | 47.1 | −0.2 |
| 1.2 | 46.0 | 46 | 0 |
| 1.4 | 45.1 | 45.2 | 0.2 |
| 1.6 | 44.5 | 44.6 | 0.2 |
| 1.8 | 44.0 | 44.1 | 0.2 |
| 2 | 43.6 | 43.7 | 0.2 |
| 3 | 42.4 | 42.3 | −0.2 |
| 4 | 41.8 | 41.7 | −0.2 |

It can be seen from Table 3 that the absolute value of the deviation between the simulation value of the temperature of the water outlet 111 of the product of this solution and the theoretical calculation value thereof is within 5%, and the accuracy of the simulation calculation data is relatively high. The heat dissipation performance and pressure loss of the product of this solution are calculated through simulation, and compared with the theoretical calculation data, the accuracy of the simulation data is verified.

The above-mentioned embodiments do not constitute a limitation on the protection scope of the technical solution. Any modifications, equivalent replacements and improvements made within the spirit and principles of the above-mentioned embodiments shall be included within the protection scope of this technical solution.

The foregoing descriptions are merely specific embodiments of the present invention, but are not intended to limit the protection scope of the present invention. Any variation or replacement readily figured out by a person skilled in the art within the technical scope disclosed in the present invention shall all fall within the protection scope of the present invention.

What is claimed is:

1. A cooling device, comprising:
a cooling plate, a lower flow channel being provided in the cooling plate, a top of the cooling plate being provided with a water outlet and two openings in communication with the lower flow channel, the water outlet being located between the two openings, the water outlet being configured to connect a water outlet nozzle, a bottom of the cooling plate being configured to be in contact with a heat source; and
a mounting cover sealed on the top of the cooling plate, the mounting cover having a C-shaped cross section, the mounting cover comprising a first mounting cover and two second mounting covers provided at both ends of the first mounting cover along a first direction, the first mounting cover and the cooling plate forming an intermediate flow channel, each second mounting cover and the cooling plate forming a branch flow channel, the intermediate flow channel being in communication with the two branch flow channels, the first mounting cover being provided with a water inlet configured to connect a water inlet nozzle, and the two branch flow channels being in communication with the lower flow channel through the two openings, respectively.

2. The cooling device according to claim 1, wherein each of the two openings is a rectangular strip opening.

3. The cooling device according to claim 1, wherein the branch flow channel is provided along a second direction perpendicular to the first direction, a length of the branch flow channel in the second direction is greater than a length of a respective one of the openings in the second direction.

4. The cooling device according to claim 1, wherein the branch flow channel is provided along a second direction perpendicular to the first direction, a length of the lower flow channel in the second direction is greater than a length of the branch flow channel in the second direction.

5. The cooling device according to claim 1, wherein the cooling plate comprises a first plate and a second plate, the first plate is fixed to the second plate, the lower flow channel is provided between the first plate and the second plate, the mounting cover is connected to the first plate, each of the two openings and the water outlet are provided on the first plate, and the second plate is configured to be in contact with the heat source.

6. The cooling device according to claim 5, wherein the first plate comprises a top plate and a frame connected to the top plate, the top plate is supported on the second plate through the frame, the second plate is provided with an annular groove, a bottom of the frame is connected in the annular groove, and the water outlet is provided on the top plate.

7. The cooling device according to claim 1, wherein both the cooling plate and the mounting cover are copper plates.

8. The cooling device according to claim 1, wherein the water outlet nozzle is a bent nozzle.

9. The cooling device according to claim 1, wherein the water inlet nozzle is a straight nozzle.

10. The cooling device according to claim 1, wherein the first mounting cover comprises a top surface and two side surfaces distributed in a second direction, and the water inlet is provided on one of the two side surfaces away from the water outlet in the second direction.

11. The cooling device according to claim 1, wherein two fin plates are provided in the lower flow channel, the two fin plates are spaced apart, and the water outlet is provided between the two fin plates.

12. The cooling device according to claim 11, wherein each of the two fin plates comprises a plurality of fins arranged in parallel and spaced apart, a through groove is formed between adjacent ones of the fins, the through groove extends along the first direction, and a respective one of the openings and the water outlet are located at both ends of the through groove, respectively.

13. The cooling device according to claim 12, wherein a spacing between the adjacent ones of the fins is 0.2 mm to 0.4 mm.

14. The cooling device according to claim 12, wherein a spacing between two fin plates is 5 mm to 6 mm.

15. The cooling device according to claim 1, further comprising a plurality of fasteners, wherein a periphery of the cooling plate is provided with a plurality of mounting holes, the fasteners extend through the mounting holes and are connected to an external mounting platform of the heat source.

* * * * *